US006675138B1

(12) United States Patent
Hollander et al.

(10) Patent No.: US 6,675,138 B1
(45) Date of Patent: Jan. 6, 2004

(54) SYSTEM AND METHOD FOR MEASURING TEMPORAL COVERAGE DETECTION

(75) Inventors: Yoav Hollander, Kiryat Ono (IL); Lev Plotnikov, Raanana (IL); Yaron Kashai, Raanana (IL)

(73) Assignee: Verisity Ltd., Rosh Ha'ayin (IL)

(\*) Notice: Subject to any disclaimer, the term of this patent is extended or adjusted under 35 U.S.C. 154(b) by 0 days.

(21) Appl. No.: 09/327,966

(22) Filed: Jun. 8, 1999

(51) Int. Cl.[7] .............................................. G06F 17/50
(52) U.S. Cl. ............................ 703/13; 703/14; 703/16; 714/38; 714/39; 714/741
(58) Field of Search ............................. 703/17, 14, 16; 714/738, 741, 33, 37, 45, 46

(56) References Cited

U.S. PATENT DOCUMENTS

| | | | | |
|---|---|---|---|---|
| 4,937,765 A | \* | 6/1990 | Shupe et al. | ................ 702/187 |
| 5,202,889 A | | 4/1993 | Aharon et al. | |
| 5,633,812 A | \* | 5/1997 | Allen et al. | ................... 703/15 |
| 5,680,332 A | \* | 10/1997 | Raimi et al. | ................ 364/578 |
| 5,844,909 A | | 12/1998 | Wakui | |
| 6,044,214 A | | 3/2000 | Kimura et al. | |
| 6,059,451 A | | 5/2000 | Scott et al. | |

OTHER PUBLICATIONS

Debany, Jr., W. et al. "Design Verification Using Logic Tests," 2nd Int'l Workshop on Rapid System Prototyping. Jun. 1991, pp. 17–24.\*
Sneed, H. "State Coverage of Embedded Realtime Programs," Proc. of 2nd Workshop on Software Testing, Verification, and Analysis. Jul. 1988, p. 245.\*
Greggain, L. et al. "Fault Grading, A Measure of Logic Simulation Integrity," 2nd Ann'l. IEEE ASIC Seminar and Exhibit. Sep. 1989, pp. P9–2/1–4.\*
Piwowarshi, P. et al. "Coverage Measurement Experience During Function Test," Proc. 15th Int'l Conf. on Software Engineering. May 1993, pp. 287–301.\*

Moundanos, D. et al. "Abstraction Techniques for Validation Coverage Analysis and Test Generation," IEEE Trans. on Computers. vol. 47, No. 1, Jan. 1998, pp. 2–14.\*
Benjamin et al, A Study in Coverage–Driven Test Generation, DAC, 1999, pp. 970–975.
Debany Jr. et al, Design Verification Using Logic Tests, IEEE, 1992, pp. 17–24.
Moundanos, et al., Abstraction Techniques for Validation Coverage Analysis and Test Generation, IEEE Transactions on Computers, vol. 47, No. 1, Jan. 1998, pp. 2–14.
Piwowarski, Coverage Measurement Experience During Function Test, IEEE Proc. 15th Int. Conf. Software Engineering, 1993, pp 287–301.
Greggain et al, Fault Grading, A Measure of Logic Simulation Integrity, Proc. 2nd Annual IEEE ASIC Seminar and Exhibit, 1989, pp 9–2.1–9–2.4.
Sneed, State Coverage of Embedded Realtime Programs, Proc. 2nd Workshop on Software Testing, Verification & Analysis, 1988, pp 245.

\* cited by examiner

*Primary Examiner*—Samuel Broda
*Assistant Examiner*—Thai Phan
(74) *Attorney, Agent, or Firm*—G. E. Ehrlich (1995) Ltd.

(57) ABSTRACT

A system and method for testing the quality of a simulation model for the DUT (device under test) through temporal coverage of the testing and verification process. Temporal coverage examines the behavior of selected variables over time, according to a triggering event. Such a triggering event could be determined according to predefined sampling times and/or according to the behavior of another variable, for example. This information is collected during the testing/verification process, and is then analyzed in order to determine the behavior of these variables, as well as the quality of the simulation model for the DUT. For example, the temporal coverage information can be analyzed to search for a coverage hole, indicated by the absence of a particular value from a family of values.

20 Claims, 3 Drawing Sheets

SYSTEM AND METHOD FOR MEASURING TEMPORAL COVERAGE DETECTION

FIELD AND BACKGROUND OF THE INVENTION

The present invention relates to a system and method for detecting and measuring coverage of a functional verification programming environment during test generation, and in particular, to a system and method for detecting and measuring such coverage over time as the simulation is performed.

Design verification is the process of determining whether an integrated circuit, board, or system-level architecture, exactly implements the requirements defined by the specification of the architecture for that device. Design verification for a device under testing (DUT) may be performed on the actual device, or on a simulation model of the device. For the purposes of explanation only and without intending to be limiting in any way, the following discussion centers upon testing which is performed on simulation models of the device.

As designs for different types of devices and device architectures become more complex, the likelihood of design errors increases. However, design verification also becomes more difficult and time consuming, as the simulation models of the design of the device also become more complex to prepare and to test.

The problem of design verification is compounded by the lack of widely generalizable tools which are useful for the verification and testing of a wide variety of devices and device architectures. Typical background art verification methods have often been restricted to a particular device having a specific design, such that the steps of preparing and implementing such verification methods for the simulation model must be performed for each new device.

The process of verifying a design through a simulation model of the device is aided by the availability of hardware description languages such as Verilog and VHDL. These languages are designed to describe hardware at higher levels of abstraction than gates or transistors. The resultant simulated model of the device can receive input stimuli in the form of test vectors, which are a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device.

Examples of testing environments include static and dynamic testing environments. A static testing environment drives pre-computed test vectors into the simulation model of the DUT and/or examines the results after operation of the simulation model. In addition, if the static testing environment is used to examine the results which are output from the simulation model, then errors in the test are not detected until after the test is finished. As a result, the internal state of the device at the point of error may not be determinable, requiring the simulation to be operated again in order to determine such internal states. This procedure consumes simulation cycles, and can require the expenditure of considerable time, especially during long tests.

A more useful and efficient type of testing is a dynamic testing environment. For this type of environment, a set of programming instructions is written to generate the test vectors in concurrence with the simulation of the model of the DUT and while potentially being controlled by the state feedback of the simulated device. This procedure enables directed random generation to be performed and to be sensitive to effects uncovered during the test itself on the state of the simulation model of the device. Thus, dynamic test generation clearly has many advantages for design verification.

Within the area of testing environments, both static and dynamic testing environments can be implemented only with fixed-vector or pre-generation input. However, a more powerful and more sophisticated implementation uses test generation to produce the environment.

One example of such a test generator is disclosed in U.S. patent application Ser. No. 09/020,792, filed on Feb. 6, 1998, incorporated by reference as if fully set forth herein. This test generation procedure interacts with, and sits as a higher level over, such hardware description languages as Verilog and VHDL. The test generation procedure is written in a hardware-oriented verification specific object-oriented programming language. This language is used to write various tests, which are then used to automatically create a device verification test by a test generator module. A wide variety of design environments can be tested and verified with this language. Thus, the disclosed procedure is generalizable, yet is also simple to program and to debug by the engineer.

The disclosed language features a number of elements such as structs for more richly and efficiently describing the design of the device to be simulated by the model. Unfortunately, the disclosed language and resultant test generation environment does not include features for testing the state of the device over time. Such testing is performed by sampling the values for various variables at different times, either according to some triggering event or at predetermined times, and is termed "temporal coverage". Temporal coverage is a collection of coverage information based on the occurrence of some pattern in time, with the pattern itself being defined according to a temporal language. Temporal coverage differs from automatic coverage, which is triggered by the appearance of a line of code or other static event, in that temporal coverage is driven by the occurrence of events in time. Temporal coverage enables the behavior of the device to be monitored over time during the testing period, particularly since a circuit or other DUT cannot be exhaustively simulated, such that all possible states are tested. Analysis of the coverage enables the designer to determine which states of the device require further testing.

Although such a testing capability would therefore be very useful to have, temporal coverage of the testing environment is not currently available, although temporal languages are known in the background art. For example, the Lustre language, which is designed for programming real-time systems, has an associated temporal logic (Halbwachs N., et al., Sixth International Symposium on Lucid and Intensional Programming, ISLIP '93, Quebec, April 1993). However, the Lustre language, like other currently available temporal languages, does not provide a mechanism for determining exact points when data is to be sampled in order to provide temporal coverage. Thus, there is no currently available combination of temporal coverage provided through a user-defined temporal language for determining coverage of the simulation of the DUT.

Therefore, there is an unmet need for, and it would be highly useful to have, a system and method for testing the behavior of the device over time through temporal coverage, which would enable more thorough and realistic testing of the device to be performed.

SUMMARY OF THE INVENTION

The system and method of the present invention tests the quality of a simulation model for the DUT (device under test) through temporal coverage of the testing and verification process. Temporal coverage examines the behavior of selected variables over time, according to a triggering event. Such a triggering event could be determined according to fixed, predefined sampling times and/or according to the occurrence of a temporal pattern of state transitions as defined by a temporal expression given in a temporal language, for example. This information is collected during the testing/verification process, and is then analyzed in order to determine the behavior of these variables, as well as the quality of the simulation model for the DUT. For example, the temporal coverage information can be analyzed to search for a coverage hole, indicated by the absence of a particular value from a family of values.

According to the present invention, there is provided a method for determining temporal coverage of a simulation model during a test verification process, the simulation model being constructed from a plurality of coverage items, the steps of the method being performed by a data processor, the method comprising the steps of: (a) providing a coverage group for examining during the test verification process, the coverage group including at least one coverage item of the simulation model; (b) providing a triggering event for determining when a state of the at least one coverage item of the coverage group is collected during the test verification process; (c) detecting the triggering event; (d) determining the state of the at least one coverage item as a collected coverage value; and (e) determining the temporal coverage at least according to a set of the collected coverage values, such that a coverage hole is determined according to an absence of a particular state of the at least one coverage item in the collected coverage value.

According to another embodiment of the present invention, there is provided a method for determining temporal coverage of a simulation model during a test verification process by a user, the simulation model being constructed from a plurality of coverage items, the steps of the method being performed by a data processor, the method comprising the steps of: (a) providing a coverage group for examining during the test verification process, the coverage group including at least one coverage item of the simulation model; (b) providing a triggering event for determining when a state of the at least one coverage item of the coverage group is collected during the test verification process, the triggering event being an event in time determined according to a temporal expression, the temporal expression being constructed by the user; (c) detecting the triggering event; (d) determining the state of the at least one coverage item as a collected coverage value; and (e) determining the temporal coverage at least according to a set of the collected coverage values, such that a coverage hole is determined according to an absence of a particular state of the at least one coverage item in the collected coverage value.

Hereinafter, the term "computing platform" refers to a particular computer hardware system or to a particular software operating system. Examples of such hardware systems include, but are not limited to, personal computers (PC), Macintosh™ computers, mainframes, minicomputers and workstations. Examples of such software operating systems include, but are not limited to, UNIX, VMS, Linux, MacOS™, DOS, FreeBSD, one of the Windows™ operating systems by Microsoft Inc. (USA), including Windows NT™, Windows 3.x™ (in which "x" is a version number, such as "Windows 3.1™"), Windows95™ and Windows98™.

The method of the present invention could also be described as a plurality of instructions being performed by a data processor, such that the method of the present invention could be implemented as hardware, software, firmware or a combination thereof For the present invention, a software application could be written in substantially any suitable programming language, which could easily be selected by one of ordinary skill in the art. The programming language chosen should be compatible with the computing platform according to which the software application is executed. Examples of suitable programming languages include, but are not limited to, C, C++ and Java.

Hereinafter, the term "non-random" refers to a process, or an entity selected by the process, which is not random but which is not necessarily deterministic.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
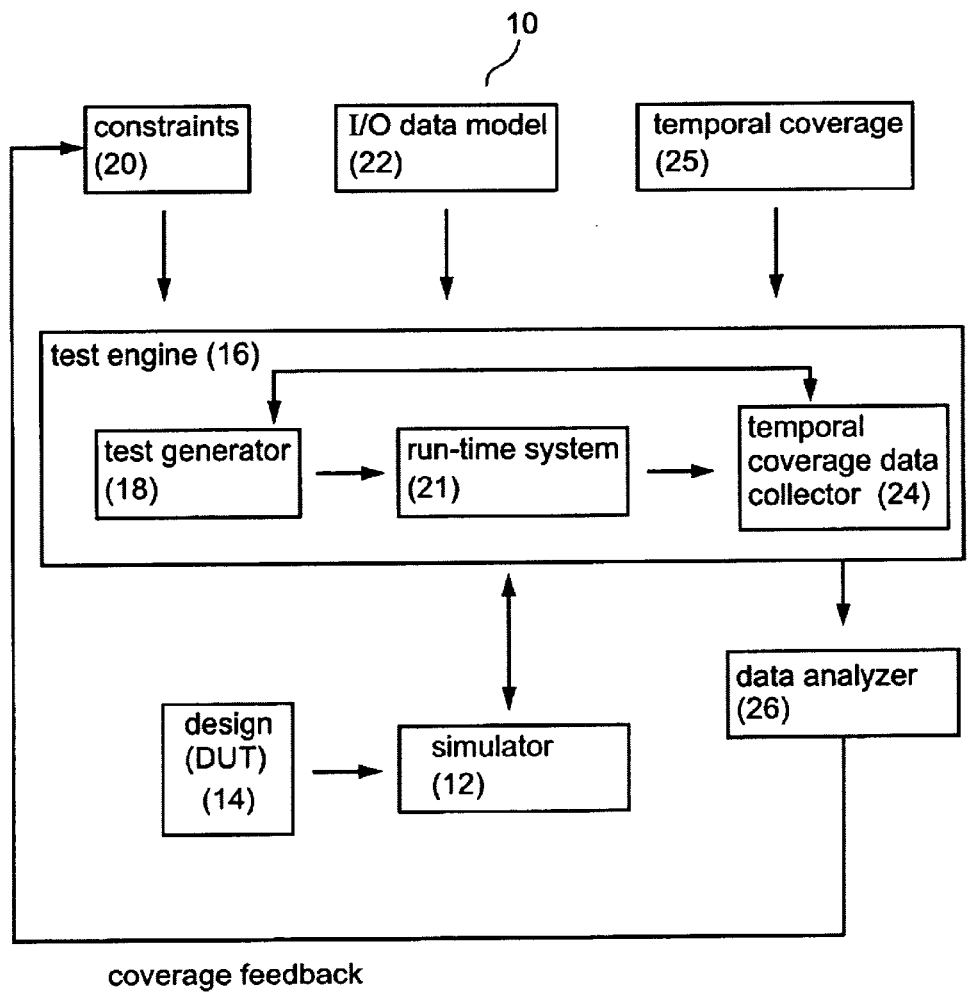
FIG. 1 is a schematic block diagram illustrating an exemplary system according to the present invention.

The system and method of the present invention tests the quality of a simulation model for the DUT (device under test) through temporal coverage of the testing and verification process. Temporal coverage examines the behavior of selected variables over time, according to a triggering event. Such a triggering event could be determined according to fixed, predefined sampling times and/or according to the occurrence of a temporal pattern of state transitions as defined by a temporal expression given in a temporal language, for example. This information is collected during the testing/verification process, and is then analyzed in order to determine the behavior of these variables, as well as the quality of the simulation model for the DUT. For example, the temporal coverage information can be analyzed to search for a coverage hole, indicated by the absence of a particular value from a family of values.

According to preferred embodiments of the present invention, particular aspects of the collected data are examined in order to determine the completeness of the coverage, and hence the quality of the simulation model for the DUT. One such examination is of "cross-coverage", in which the values of one or more variables are examined, given a particular value for a certain variable. Coverage holes may be located for multi-dimensional cross-coverage, in which many different variables are examined simultaneously.

Another optional but preferred examination performed by the system and method of the present invention is the analysis of transition coverage. Each transition represents a change from one state of a variable to a neighboring state, such that the analysis of transition coverage involves the examination of transitions to neighboring states. A coverage hole may be detected if a particular transition never occurs during the testing/verification process for the DUT.

A third optional but preferred examination is the analysis of interval coverage. Such an interval is a period of time with a start point and an end point defined according to a particular event and/or a predefined point in time. A third point in time within this interval is then examined to determine the state of a particular variable or variables, or the occurrence of a particular event. Rather than being a single discrete point in time, optionally and preferably the third point could include one or more nesting intervals in time. A coverage hole could then be defined as the lack of such an occurrence, or the absence of a particular value from the set of values for the variable(s) being examined, for example.

According to another optional but preferred embodiment of the present invention, the coverage provided by the simulation model of the DUT is measured by coverage grading, which is a quality metric for measuring the provided coverage. Coverage grading is a process in which a "grade" or score is assigned to each cover "bucket" or range of values for a particular variable, cover item and cover group. An overall grade is preferably assigned for the entire simulation model after the test/verification process has been performed. Coverage grading provides an overall measure for the quality of coverage, thereby enabling the user to further determine the efficacy of the simulation model.

The principles and operation of the system and method according to the present invention may be better understood with reference to the drawings and the accompanying description.

Referring now to the drawings, FIG. 1 is a schematic block diagram illustrating an exemplary system according to the present invention for test generation. It should be noted that the illustrated system only includes those functions of the test generation procedure which are required for the description of the present invention. A more complete description of the entire test generation procedure may be found in U.S. patent application Ser. No. 09/020,792, previously incorporated by reference.

A test generation system 10 features a simulator 12, which may accept a design 14 for the device under test (DUT), written in a hardware descriptive language such as Verilog or VHDL. In addition, simulator 12 interacts with a test engine 16 for performing the test generation procedure at run-time. The interaction between simulator 12 and test engine 16 is shown as bi-directional, since test engine 16 provides input to simulator 12, and in turn receives the results from simulator 12 as input for further operation.

Test engine 16 features a test generator 18, connected to a run-time system 21 for testing DUT 14 at run-time. Test generator 18 receives one or more constraints 20 and an I/O data model 22, and then performs the testing and verification of DUT 14. Run-time system 21 both drives and samples simulator 12 during the run-time testing procedure. Run-time system 21 also evaluates temporal expressions and emits events. These events are defined according to a temporal coverage event definition input 25, which feeds the definitions of the events to be covered to run-time system 21.

During the process of testing and verification, a temporal coverage data collector 24 requests the values for one or more variables from run-time system 21. These requests are performed according to a triggering event emitted by run-time system 21, such as a fixed, predefined sampling time and/or the occurrence of a temporal pattern of state transitions as defined by a temporal expression given in a temporal language, for example. Temporal coverage data collector 24 is able to communicate with test generator 18 and to access the requested data through the API (application programming interface) for test generator 18. Such an API specifies the software function calls required in order to collect the desired data. This collected data is then analyzed by a data analyzer 26, as described in greater detail below.

After being analyzed by data analyzer 26, the analyzed data is then displayed to the user, preferably through a GUI (graphical user interface; not shown). For example, the data could be displayed to indicate the presence of particular coverage holes for single coverage items, cross-coverage items and/or interval coverage items. According to a preferred embodiment of the present invention, the analyzed data is used as feedback to adjust constraints 20 according to the coverage afforded by these constraints. For example, if a coverage hole or holes were found, constraints 20 could be adjusted in order to test the absent state or states of DUT 14. Such feedback is preferably performed automatically, but could also optionally be performed manually by the user.

According to a preferred embodiment of the present invention, and as described in further detail below, constraints 20, I/O data model 22 and temporal coverage 25 are preferably constructed in e code, which is the code language provided by the Specman™ functional programming environment (Verisity Design, Inc., Mountain View, Calif., USA) and disclosed in U.S. patent application Ser. No. 09/020,792. Such an embodiment is preferred because of the ease and flexibility of programming in e code. The following description centers upon this preferred embodiment, it being understood that this is for the purposes of description only and is not meant to be limiting in any way.

The e code language is a hardware-oriented verification specific object-oriented programming language. Objects in this language are instances of "structs", which contain a field, and one or more functions, or methods, which operate on data stored within the field and which interact with other objects. Optionally, a constraint can operate on the field, thereby altering the data stored in the field, for example by restricting the range of possible values for the data. The field can also be used to store more complex structures, including other structs and lists of scalars or structs.

The process of test generation fills data elements, including structs and fields, with random values. The possible data values for each element can optionally be limited by constraints, which provide the direction for the directed test generation. During the process of test generation, the values for different variables can be sampled for temporal coverage, according to triggering events. Such a triggering event could be determined according to fixed, predefined sampling times and/or according to the occurrence of a temporal pattern of state transitions as defined by a temporal expression given in a temporal language, for example. The following section describes a number of illustrative command structures for temporal coverage in the e code language, it being understood that these command structures are only being given for the purposes of illustrating a particularly preferred embodiment of the present invention.

For the preferred embodiment of the present invention, temporal coverage is specified through instances of coverage structs. Coverage struct members define specific data objects for collection of values of variables during the simulation time, also termed a "coverage group". The definition for the coverage group is associated with an event. Coverage data is collected by sampling each cover item each time that the event for that coverage group occurs. For this exemplary embodiment, the syntax for specifying such a coverage member is cover name [using cover-group-options] is [also] cover-item-definition [; . . . ]

in which the keyword "name" is the name for that instance of the cover struct. The "is" keyword indicates the definition of a new cover group, while the "cover-item-definition" defines the cover group. The keyword "using" is used for invoking particular cover group options, described in greater detail below.

The "cover-item-definition" optionally and preferably can be defined according to several different syntaxes. The first syntax, "item name [:type=exp] [using cover-item options]" defines a new cover item by using name. If:type=exp, which is an expression, is specified, then the given expression is evaluated when the entire coverage group is sampled and the value for the evaluated expression is then used for the defined cover item. Otherwise, the struct field with the given name is sampled and used as the value for this cover item.

The expression "using cover-item options" is used to further define the coverage item. For example, one such option is to determine "buckets" or ranges of values for the coverage item, for collecting the data in a more space efficient manner (as described in greater detail below) and/or for determining how the collected data is to be displayed. Each such range, or bucket, is explictly defined. Optionally and preferably, values which are to be ignored and not collected are defined in an "ignore set" option. Preferably, two additional buckets are provided automatically: an "illegal" bucket to hold all illegal values; and an "other" bucket to hold all values which do not fall into a defined range. The illegal values are defined according to an "illegal set" option.

The second syntax, "transition name [using cover-item-options]", defines transition points to cover. As noted previously, such transition points occur when a variable changes from a particular state to a neighboring state. The transition points are examined for the coverage group with the same name as the value for the keyword name.

The third syntax, "cross name1, name2 . . . [using cover-item-options]", defines cover points for cross-coverage, in order to examine the relationships between different variables as previously described. The cover points are examined for the coverage groups with the same names as the valuess for the keywords name1, name2, and so forth.

A preferred option for this exemplary embodiment of the present invention is the provision of cover group options, as noted previously. Such cover group options include, but are not limited to, the expressions "when=bool-exp", "global" and "count_only". The expression "when=bool-exp" determines that the coverage group is only sampled when the expression "bool-exp" is true. The expression global specifies a global group, which applies to the entire test process, such that no specific timing is implied.

The expression count_only refers to a particularly preferred embodiment of the present invention, which reduces the amount of storage space required for storing the collected data by maintaining the stored data only as numbers, rather than as a collection of values. For example, for simple coverage items, the number of items for each bucket is stored. For cross-coverage items, a matrix of such numbers for each bucket is stored. For interval items, the number of instances when the desired third coverage point occurred is stored. Thus, the amount of storage space is significantly reduced.

Temporal expressions are constructed recursively from other temporal expressions and temporal operators. Simple temporal operators include for instance, value transitions of variables. In the e code language, these are preferably expressed as "rise(<var>)", "fall(<var>)", and "change (<var>)", for an increase, decrease or general change in the specified variable, respectively. Such variables could belong to either the DUT, the test environment or the generated input. Additional simple temporal operators include testing a Boolean condition in time, denoted as "true(<condition>)". The occurrence of an event can also be used as a simple temporal operator, denoted by a "@" symbol in front of the name of the event.

Sequences of temporal expressions can be constructed by the sequencing operator ";". The sequence "{<te1>; <te2>}" represents a pattern in time in which <te1> succeeds first and <te2> succeeds subsequently. The sequence is considered to be fulfilled at the point in time in which the final sub-expression in the sequence succeeds.

The conjunction and disjunction of temporal expressions can be represented by the temporal operators "and" and "or" respectively. The success and failure of a temporal expression can be negated by the "fail" operator.

A temporal expression is evaluated in the presence of a sampling event, which is either explicitly assigned, through the sampling operator, or alternatively can be taken from the context. The occurrence of the sampling event defines discrete points in time in which the associated temporal expression is evaluated.

In addition to collecting functional coverage, temporal expressions can be used to time activity, such as the injection of stimuli into the DUT. They may also be used to track the behavior of the DUT and to report violations of the permissible temporal patterns.

The events which trigger collection of data are struct members defined according to the following syntax:

event event-name [is [only] temporal-expression]

in which the event is named by event-name, and the temporal expression which is to be attached to this event is given by temporal-expression. The temporal expression is constructed in the temporal language which is described in greater detail below. The temporal expression can be an event, or optionally can be a combination of one or more events and one or more temporal operators. For example, the event could be emitted only if a particular condition has occurred, as determined by evaluating an expression. Alternatively, the event could be forced to emit regardless of whether the condition occurred, by using the emit option.

The temporal expression could be used to synchronize two or more events with the sync option, such as two or more time consuming methods (methods which consume clock cycles in a chip, for example). This option suspends execution of a particular time consuming method until the associated temporal expression is found to be true. Similarly, the wait option suspends execution until the next clock cycle after the attached temporal expression is true. Other options can be used to define expected behavior with the expect option, such that if an expected condition is not found, then the expression returns an error. Of course, many other options are possible within the context of temporal expressions, it being understood that these are only examples.

The temporal expression preferably is associated with a sampling event. The sampling event can simply require sampling of a particular variable, or cover item, for example. The sampled data is then passed to temporal coverage data collector 24.

Although this temporal language is preferred for the present invention, it is understood that this is given as an example only and without any intention to be limiting, since other temporal languages could also be used with the method of the present invention.

An example of a program with coverage groups for temporal coverage is given below, in order to demonstrate the power and efficacy of the method and system of the present invention. This example is illustrative only and is not intended to be limiting in any way. For a more complete explanation of the commands, see U.S. patent application Ser. No. 09/020,792, previously incorporated by reference.

The first part of the program gives various type definitions for the different variables which are to be used in the remainder of the program:

type reg: [REG0, REG1, REG2, REG3] (bits: 2);

defines the enumerated type reg as having the values REG0, REG1, REG2, and REG3, all represented as two bit values.

The statement:

type command: [ADD, ADDI, SUB, SUBI, AND, ANDI, XOR, XORI, JMP, JMPC, CALL, RET, UDEF] (bits: 4);

defines the type command as having the four bit values listed within the square brackets, which are different commands which could be invoked within the simulation model of the DUT, which is a simple controller but which is not included within this sample program.

The last type statement is:

type opcode_type: [logical, arithmetic, branch];

which defines the type opcode_type as having the values "logical, arithmetic, and branch".

The next code defines a global event called "cpu_clk" which is attached to a temporal formula. The temporal expression rise(<expression>) succeeds each time the value of <expression> is changed from 0 to 1. In this case the expression is the clock wire of the simulated system. The sampling is determined according to "@sim", such that the expression is evaluated at the exact moment of value change:

```
extend sys {
    event cpu_clk is rise('top.cpu_clock')@sim;
};
```

The next statements define a struct, with restrictions placed on the values for various variables and with a basic event defined. This event is a triggering event which will cause coverage to be triggered, and data to be collected, when the event occurs. The first statements define a number of variables as being of the types defined previously:

struct inst {
      opcode: command;
      op1: reg;
      kind: [imm, reg];
      type: opcode_type;

Next, restrictions are placed on the values of these variables. For example, the statement:

keep opcode in [AND, ANDI, XOR, XORI]—>>type== logical;

requires that when "opcode" takes one of the values listed in square brackets, type has to be of the value logical. The remaining restrictions are defined as follows:

keep opcode in [ADD, SUB, ADDI, SUBI]—>>type== arithmetic;
    keep opcode in [JMP, JMPC, CALL , RET, UDEF] —>>type==branch;
    keep opcode in [ADDI, SUBI, ANDI, XORI, JMP, JMPC, CALL]—>>kind==imm;
    keep opcode in [ADD, SUB, AND, XOR, RET, UDEF] —>>kind==reg;

The next code states that depending on whether the "kind" field has the value "imm" or "reg", the following extensions to the struct "inst" are defined:

```
when imm inst { // second op is a memory location
    op2    : byte;
};
when reg inst { // second op is a register
    op2    : reg;
};
```

This next statement indicates that there is a triggering event which causes data to be collected:

extend inst {
    event fetch is rise('top fetch') and true(sys.current_inst==me) @sys.cpu_clk;

For the event "fetch" to occur, the following conditions need to be true. First, the "fetch" signal in the simulation model must rise and the current instruction pointer in the environment must point to the fetched instruction.

event stall;

The event "stall" is emitted by the system, but is not attached to a temporal formula.

event exec is (rise('top.pipe_exec') and not @fetch) @sys.cpu_clk;

The event "exec" occurs when the "pipe_exec" register in the simulation model is set, and the current instruction is not fetched.

```
    event start is {@fetch; [0..2] * @stall; @exec} @sys.cpu_clk;
};
```

The event "start" occurs when the attached temporal expression succeeds. The temporal expression is a three element sequence. The first sub-expression is the occurrence of the event "fetch". The second sub-expression is an optional event, "stall", which may not occur, but otherwise occurs either once or twice in the sequence. The third sub-expression is the occurrence of the event "exec". All the sub-expressions must follow each other in the described sequence, and are synchronized with the attached sampling event "sys.cpu_clk".

Now the struct is extended, including the definition of the cover group attached to the event, with the first statements identifying some cover items:

extend inst {
      cover start is {
        item opcode;
        transition opcode;

The statement "item opcode" requires the value for "opcode" to be collected. The statement "transition opcode" states that the transition to the state "opcode" is to be collected.

The next statement defines a coverage item, with a descriptive text string, "the first operand":

item op1 using text="the first operand";

For the next coverage item, the data is collected from the field "op1":

item op1_margin: reg=op1
    using text="the first operand, at least 10",
    at least=40;
Also, for this coverage item, there is a descriptive text string, "the first operand, at least 10". In addition, the option "at_least" has been set to indicate the minimum number of samples for each bucket of the cover item "op1_margin", such that if fewer than 40 samples in this case have been collected, it is considered to be a coverage hole.

The next two statements indicate that data should be collected for the two coverage items "kind" and "type" after the triggering event has occurred:
    item kind;
    item type;
The next statements cross the various coverage items, in order to determine what the value for each variable is, given a particular variable for the other variables, as previously described:
    cross type, kind, op1 using name=instruction,
        cross opcode, op1,
        cross kind, op1;
The next statement defines a cover item using the variable "opcode":
    item op: command=opcode;
Then transition coverage is determined for this cover item with an "ignore set", such that whenever the expression within the parentheses returns true, the data is ignored. In this situation, data is ignored if the previous operation was not a "jump" or a "call" operation, and the next operation is within the set defined as "[ADD . . . SUBI]":

```
    transition op using
        ignore=(not ((prev_op in [JMP..CALL]) and (op in
    [ADD..SUBI])));
        };
```

The next two sets of statements are invoked according to the "kind" field, as previously described. Each set contains an expression which starts with the word "illegal" and which determines the set of illegal values for the cover item "opcode":

```
when imm inst {
        cover start is also {
            item imm_op2: byte = op2 using ranges = {
    range([0..255],"", 32)};
            cross op1, imm_op2;
            cross opcode, op1, imm_op2 using name = imm_inst,
                illegal = opcode in [ADD, SUB, AND, XOR, RET,
    UDEF];
        };
    };
    when reg inst {
        cover start is also {
            item reg_op2: reg = op2;
            cross opcode, op1, reg_op2 using name = reg_inst,
                illegal = opcode in [ADDI, SUBI, ANDI, XORI,
    JMP, JMPC, CALL];
        };
    };
};
```

According to a preferred embodiment of the present invention, a quality for the coverage metric, previously described as coverage grading, is provided. Coverage grading is a process in which a "grade" or score is assigned to each cover "bucket", cover item and cover group. An overall grade is preferably assigned for the entire simulation model after the test/verification process has been performed.

Coverage grading is more preferably determined according to one of two formulas, a linear formula and a root mean square formula. The linear formula computes the grade for a bucket according to the "fullness" of the bucket, which is the number of samples in the bucket, optionally divided by a number which indicates the expected and/or desired number of samples to be obtained. The grade for a coverage item is then determined by summing the grades for the buckets for that item, optionally multiplied by some weighting factor for one or more individual buckets. The grade for a coverage group is then determined by summing the grades for the coverage items in the group, again optionally multiplied by some weighting factor for one or more individual coverage items.

The root mean square formula places more emphasis on the first samples to be placed in each bucket and in each coverage item. The coverage grading for a bucket is then computed as the square root of the fullness of the bucket, in which the fullness of the bucket is calculated as previously described for the linear formula. The grade for a coverage item is defined as the square root of the square of the sum of the grades for all buckets, optionally multiplied by a weighting factor.

More preferably, the cost for performing one or more test/verification procedures on a simulation model is determined as the sum of the time required from the user, and the time required from the system, in order to perform the test/verification procedures. Most preferably, such a cost is combined with the previously described coverage grading, in order to determine the effectiveness of the tests.

Furthermore, most preferably a coverage maximization function is provided, in order to determine which tests are most likely to provide maximal coverage. This function calculates the best set of test/verification procedures to perform, given an initial group of tests, a grading formula, a cost formula and an allotted budget, such that the costs for the set stay within the budget, yet provide the maximum coverage.

Figure 2:
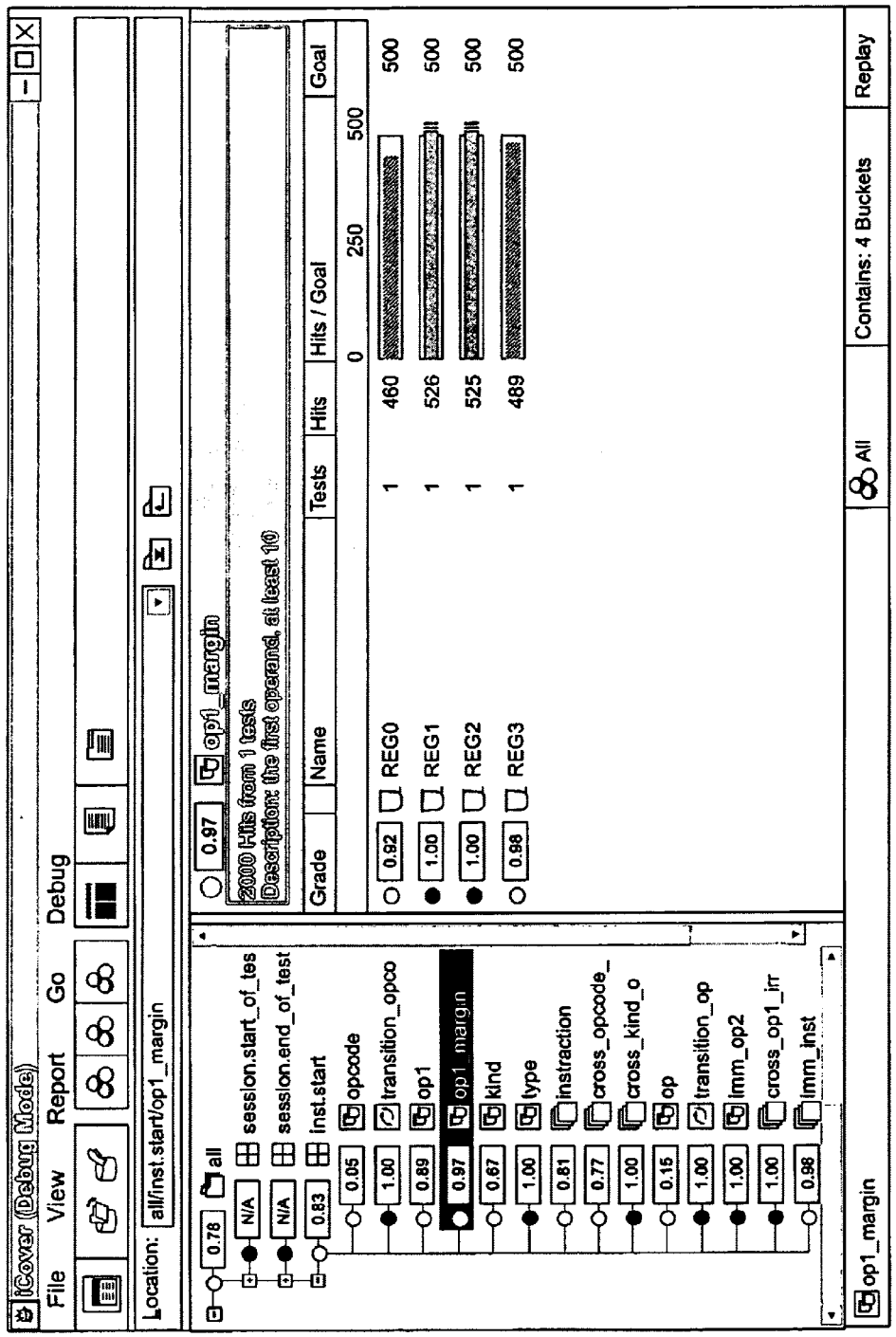
FIG. 2 is an illustrative picture from the GUI (graphical user interface) of the software of the present invention, showing exemplary coverage results.

FIG. 2 is an illustrative picture from the GUI (graphical user interface) of the software of the present invention, showing exemplary coverage results. The panel on the left contains a list of cover groups, with the group "inst.start" being expanded to show the list of cover items. The panel on the right shows the buckets for the selected cover item "op1_margin", with the number of hits shown relative to a pre-defined goal. The count is represented graphically by the bar-charts, under the heading "Hits/Goal". All cover groups, items and buckets have their computed grade represented numerically and graphically in the rectangle by their names, under the heading "Grade".

Figure 3:
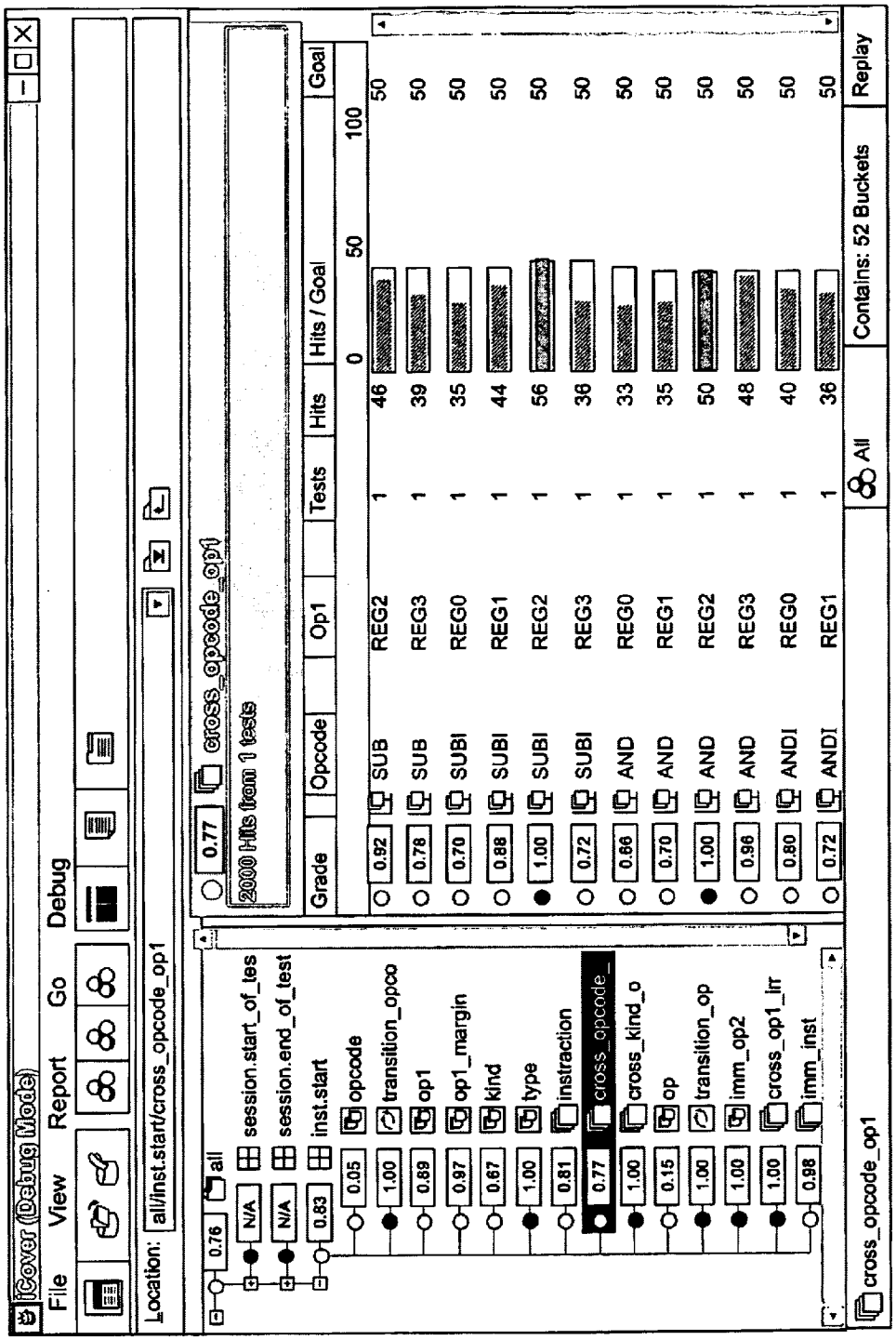
FIG. 3 is an illustrative picture from the GUI (graphical user interface) of the software of the present invention, showing exemplary cross-coverage results

FIG. 3 is an illustrative picture from the GUI (graphical user interface) of the software of the present invention, showing exemplary cross-coverage results. The panel on the left is similar to that of FIG. 2. The panel on the right is displaying the cross coverage of the coverage items "op1" and "opcode". Every bucket displayed has a unique value for "opcode" and a unique value for "op1" associated with it. The count is represented graphically by the bar-charts, under the heading "Hits/Goal". The coverage grading is represented for the coverage group, items and buckets in the rectangle by the name, under the heading "Grade".

While the invention has been described with respect to a limited number of embodiments, it will be appreciated that many variations, modifications and other applications of the invention may be made.

What is claimed is:

1. A method for determining temporal coverage of a simulation model during a test verification process, the simulation model being constructed from a plurality of coverage items, the steps of the method being performed by a data processor, the method comprising the steps of:

(a) providing a coverage group for examining during the test verification process, said coverage group including at least one coverage item of the simulation model;

(b) providing a triggering event for determining when a state of said at least one coverage item of said coverage group is collected during the test verification process;

(c) detecting said triggering event;

(d) determining said state of said at least one coverage item as a collected coverage value; and (e) determining the temporal coverage at least according to a set of said collected coverage values, such that a coverage hole is determined according to an absence of a particular state of said at least one coverage item in said collected coverage value.

2. The method of claim 1, wherein said coverage group is determined by a human user in step (a).

3. The method of claim 2, wherein said triggering event is determined according to a temporal expression, such that said triggering event is a time-based event.

4. The method of claim 3, wherein said triggering event is determined according to a state of at least one coverage item of the simulation model during the test verification process.

5. The method of claim 3, wherein said triggering event is at least one predetermined point in time during the test verification process.

6. The method of claim 5, wherein said at least one predetermined point includes at least one range in time.

7. The method of claim 1, wherein said coverage group also includes a Boolean expression, such that said state of said at least one coverage item is only collected if said Boolean expression is true.

8. The method of claim 1, wherein said coverage item also includes a plurality of buckets for holding said state of said at least one variable after collection, each bucket being a range of values, such that said coverage hole is defined by an empty bucket.

9. The method of claim 8, further comprising the steps of:

(f) providing a GUI (graphical user interface) for a user; and (g) reporting the temporal coverage to the user through said GUI, such that each of said plurality of buckets is graphically represented according to a number of collected coverage values in said bucket.

10. The method of claim 9, wherein said collected coverage values are only stored as said number of collected coverage values in said bucket.

11. The method of claim 10, wherein steps (c) and (d) are repeated at least once, such that said set of collected coverage values includes a plurality of collected coverage values.

12. The method of claim 11, wherein steps (a)–(d) are determined for a plurality of coverage items of the simulation model, said coverage group includes a plurality of coverage items and steps (b)–(d) are repeated for each of said plurality of coverage items, the method further comprising the step of:

(h) after the test generation process is complete, calculating a coverage grade for at least one of said coverage group, said coverage item and said bucket, said coverage grade indicating the test coverage.

13. The method of claim 12, wherein said coverage grade is calculated for the entirety of said coverage groups and the entire test verification process according to a combination of said coverage grades for said coverage groups.

14. The method of claim 13, wherein said coverage grade is calculated for said bucket at least partially according to said number of collected coverage values.

15. The method of claim 14, wherein the simulation model is simulated according to a plurality of constraints, the method further comprising the step of:

(i) adjusting said plurality of constraints according to said coverage grade.

16. A method for determining temporal coverage of a simulation model during a test verification process by a user, the simulation model being constructed from a plurality of coverage items, the steps of the method being performed by a data processor, the method comprising the steps of:

(a) providing a coverage group for examining during the test verification process, said coverage group including at least one coverage item of the simulation model;

(b) providing a triggering event in time determined according to a temporal expression, said temporal expression being constructed by the user, for determining when a state of said at least one coverage item of said coverage group is collected during the test verification process;

(c) detecting said triggering event;

(d) determining said state of said at least one coverage item as a collected coverage value; and (e) determining the temporal coverage at least according to a set of said collected coverage values, such that a coverage hole is determined according to an absence of a particular state of said at least one coverage item in said collected coverage value.

17. The method of claim 1, wherein said triggering event is determined according to an occurrence of a temporal pattern of state transitions.

18. The method of claim 17, wherein said temporal pattern of state transitions is defined by a temporal expression in a temporal language.

19. A method for examining behavior of at least one selected variable over time in a simulation model for a device under test (DUT) in a test environment during a test verification process, the simulation model being constructed from a plurality of variables, the steps of the method being performed by a data processor, the method comprising the steps of:

(a) providing a coverage group for examining during the test verification process, said coverage group including at least one variable of the simulation model;

(b) providing a triggering event for determining when a state of said at least one variable of said coverage group is collected during the test verification process;

(c) detecting said triggering event;

(d) determining said state of said at least one variable as a collected coverage value; and (e) determining the behavior of at least one selected variable over time at least according to a set of said collected coverage values, such that a coverage hole is determined according to an absence of a particular state of said at least one variable in said collected coverage values.

20. The method of claim 19, wherein said triggering event is determined according to a change in a state of at least one variable from an initial state to a neighboring state, the method further comprising the step of:

(f) analyzing transition coverage of said at least one variable by examining said change in said state of said at least one variable from said initial state to said neighboring state.

* * * * *